United States Patent [19]
Shi et al.

[11] Patent Number: 5,902,677
[45] Date of Patent: May 11, 1999

[54] MODIFIED ANODE FOR A DISPLAY DEVICE

[75] Inventors: Song Shi, Phoenix; Franky So, Tempe, both of Ariz.; Hsing Chung Lee, Calabasas, Calif.

[73] Assignee: Motorola, Inc, Schaumburg, Ill.

[21] Appl. No.: 08/734,565

[22] Filed: Oct. 21, 1996

[51] Int. Cl.⁶ ........................................................ B32B 5/16
[52] U.S. Cl. .......................... 428/332; 313/503; 313/504; 313/505; 313/506
[58] Field of Search .............................. 428/332; 313/503, 313/504, 505, 506

[56] References Cited

U.S. PATENT DOCUMENTS

| | | | |
|---|---|---|---|
| 4,356,429 | 10/1982 | Tang | 313/503 |
| 4,750,816 | 6/1988 | Ito et al. | 350/357 |

OTHER PUBLICATIONS

Article entitled Organic Electroluminescent Devices by Sheats, et al. *Science*, vol. 273, Aug. 16, 1996, pp. 884–888.

*Primary Examiner*—Melvyn I. Marquis
*Attorney, Agent, or Firm*—Eugene A. Parsons

[57] ABSTRACT

An organic electroluminescent display device (10) includes a plurality of organic layers (16, 18, and 20) disposed between opposing electrode assemblies (12 and 14). One electrode assembly (12), the anode assembly, is fabricated of a substrate (22) and electrode (24), and a layer of a compensating material (26) disposed between electrode (24) and the overlying layers of light emitting materials (16, 18, 20). Layer (26) compensates for physical mismatches between the inorganic electrode layer (24) and the organic light emitting layers (16, 18, 20).

13 Claims, 1 Drawing Sheet

MODIFIED ANODE FOR A DISPLAY DEVICE

TECHNICAL FIELD

This invention relates in general to flat panel information display devices and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the phosphors surface of the display surface, CRTs have a substantial depth dimension. Accordingly, CRTs have little use in small and portable applications, such as handheld televisions, laptop computers, and other portable electronic applications which require the use of displays.

To answer the needs of the marketplace for smaller, more portable display devices, manufacturers have created numerous types of flat panel display devices. Examples of flat panel display devices include active matrix liquid crystal displays (AMLCD's), plasma displays, and electroluminescent displays. Each of these types of displays has use for a particular market application, though each are accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. As used herein, the charge carriers which combine in the emissive layer are electrons and holes. The electrons are negatively charged atomic particles and holes are positively charged counterparts. OED's are attractive owing to low driving voltage, i.e., less than about 20 volts. Hence, they have a potential application to full color flat emissive displays.

One problem which has plagued OED's has been the stability of the devices, and in particularly the thermal stability of the hole transporting material. Degradation in these materials have been observed and are typically attributable to one of two problems: (1) phase stability of hole transporting materials, namely the tendency to recrystallize or aggregate, which is a function of the glass transition temperature of the hole transporting material; and (2) the adhesion of hole transporting materials which are typically organic, to the materials from which the electrodes are typically fabricated, which are generally inorganic. These problems may be due to thermal expansion coefficient mismatch and surface tension mismatch (hydrophobicity or hydrophilicity) between the organic hole transporting material and the inorganic electrode materials.

To address issues arising from this mismatch between the organic and inorganic layers, numerous solutions have been proposed. For example, in U.S. Pat. No. 4,356,429, it was proposed to insert a thin layer of organometallic material between the organic and inorganic materials. The organometallic materials have physical properties which are between those of the organic and inorganic materials and thus serve as a buffer layer. Examples of such organometallic materials include metal phthalocyanine complexes such as copper phthalocyanine, and zinc phthalocyanine. Another solution was proposed in an article authored by J. Sheats, et al in *Science Magazine* (Science 273, 884, (1996)) which describes spincoating a thin layer of polyaniline between the organic and inorganic materials. The article reports that the lifetime of the OED was drastically increased.

While each of these approaches provides a solution to the problem, there are numerous shortcomings attendant to each. For example, organometallic materials described in the '429 patent are both relatively expensive and difficult to deposit with high reliability. Similarly, spincoat deposition of polyaniline between the hole transporting and ITO materials is a relatively difficult process which may both increase the cost and decrease the manufacturing yield of OED's.

Accordingly, there exists a need for improved anode structures for use in the OED's. The anode structures should enhance the thermal coefficient matching and the surface tension matching between the organic hole transporting layer materials and the inorganic anode electrode materials. The intervening layer between the organic and inorganic materials should be fabricated of a relatively inexpensive material which can be deposited via readily available, highly-reliable, inexpensive processes.

DETAILED DESCRIPTION OF THE PREFERRED EMBODIMENT

Figure 1:
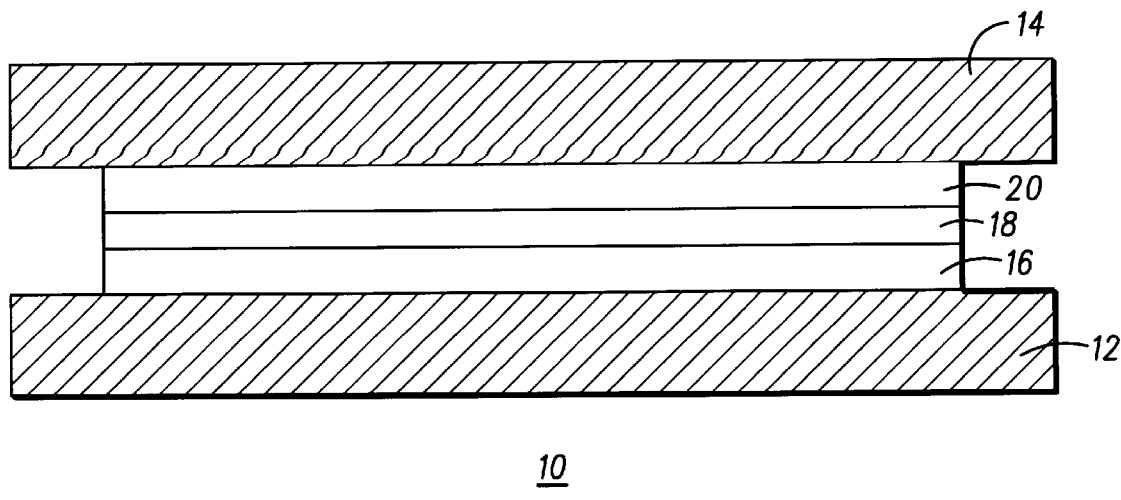
FIG. 1 is a cross-sectional side view of an organic electroluminescent device in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein an organic electroluminescent device 10 as is well known in the art. The device contains, as a rule, one or more layers of organic charge transport materials. Device 10 is fabricated of two electrode structures 12 and 14, electrode structure 12 being the anode electrode assembly, and electrode structure 14 being the cathode assembly. The anode and cathode assemblies, and particularly the anode assembly 12 will be described in greater detail hereinbelow.

Operatively disposed between the anode and cathode assemblies are a plurality of layers of organic electroluminescent materials. A first layer 16 deposited atop the anode assembly 12 is a layer of a hole transporting material. The purpose of the hole transporting material is to facilitate transfer of holes from the anode assembly 12 to the emitter layer. In the emitter layer, holes are combined with electrons provided via the electron transporting layer from the cathode assembly 14 to create photons for the emission of light. The hole transporting material layer 18 may be fabricating of any of the number of known materials which are known in the art, though in one preferred embodiment the hole transporting material may actually be a multicomponent compound consisting of a hole transporting material and a polymeric network selected to stabilize the hole transporting material, particularly at elevated temperatures. Examples of this type of a hole transporting material are disclosed in, for example, commonly assigned copending U.S. patent application Ser. No. 08/706,898 entitled Polymer Stabilized Molecular Hole Transporting Materials For Organic Electroluminescent Displays filed on Aug. 30, 1996 in the names of Song Shi, et al, the disclosure of which is incorporated herein by reference.

Thereafter deposited atop the hole transporting layer 16 is a layer of a emitter material 18. The emitter layer 18 is typically comprised of a host emitting matrix and a guest emitter. The host emitting matrix is fabricated of a organic material adapted to accommodate both holes and electrons and then transfer the excited state energies to the guest emitter where the holes and electrons combine and emit a photon of light causing a visible change in the appearance of the OED device to a viewer thereof. The materials that can be used as the host emitting matrix include metal chelated oxinoid compounds disclosed in, for example, U.S. Pat. Nos. 4,769,292 and 5,529,853, as well as in commonly assigned copending U.S. patent application Ser. No. 08/304,451 filed Sep. 12, 1994, the disclosures of which are incorporated herein by reference. Examples of the preferred host emitting matrix materials are selected from tris(8-quinolinol) aluminum, bis(10-oxo-benzoquinine beryllium), bis(2-(2-oxy-phenyl)benzoxazole)zinc, 2-(2-oxy-phenyl benzothiazole) zinc and combinations thereof. The materials which can be used as a guest emitter include dyes and pigments of high fluorescent efficiencies. For efficient energy transfer it is necessary that the guest emitter material has a band gap no greater than that of the material making up the emitting host matrix. It is preferred that the guest emitter material is present in a concentration of from $10^{-3}$ to 10 mole % based on the moles of materials comprised of the emitting host matrix. The selection of the guest emitting materials is well known to those of ordinary skill in the art.

Thereafter deposited atop the emitter layer 18 is an electron transporting layer 20 fabricated of the material selected from the group of materials disclosed in U.S. Pat. Nos. 4,769,292 and 5,529,853 as well as in commonly assigned copending U.S. patent application Ser. No. 08/304, 451 filed Sep. 12, 1994, the disclosures of which are incorporated herein by reference. The electron transporting layer is adapted to gather charge carriers, in this case, electrons, from the cathode assembly 14 for transport to the emitter layer where they are combined with holes in a manner described hereinabove. In this regard, appropriate transport materials include tris(8-quinolinol) aluminum, bis (10-oxo-benzoquinoline beryllium), bis(2-(2-oxy-phenyl) benzoxazole)zinc, 2-(2-oxy-phenyl benzothiazole) zinc and combinations thereof.

In operation, holes inject from the anode assembly and electrons inject from the cathode assembly into the organic layers disposed between the two assemblies, when an electrical current is applied between the anode and the cathode. An electrical current may be applied by connecting the electrodes to electrical current generation means (not shown) at electrical contacts on each of the anode and cathode assembly.

Figure 2:
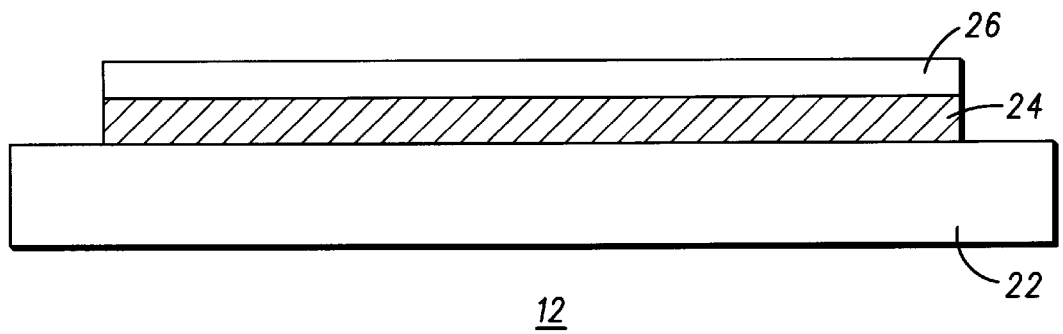
FIG. 2 is a cross-sectional side view of an anode structure for an organic electroluminescent device in accordance with the instant invention.

Referring now to FIG. 2, there is illustrated therein an anode assembly in accordance with the instant invention. The anode assembly 12 is fabricated upon a first substrate 22 which is transparent and may be fabricated from any of the number of known materials employed in the art. For example, substrate 22 may be fabricated of a glass such as Corning 7059 glass, transparent plastic substrates made of polyolefins, polyethyl sulfones, polyacrylates and combinations thereof. In one preferred embodiment, the substrate 22 is fabricated of a high quality glass such as that commonly used for the fabrication of flat panel display devices.

Deposited atop substrate 22 is an electrode layer 24 which is electrically conductive and optically transparent or semi-transparent. Several materials may be advantageously employed as the first electrode 24 in the anode assembly 12 of an OED device. Examples of materials include conductive metal oxides such as indium oxide, indium tin oxide, (ITO), zinc oxide, zinc tin oxide, vanadium oxide, and combinations thereof. Alternatively, the electrode 24 may be fabricated of a semi-transparent metal, examples of which include a thin layer (less than 500 Å) of gold, copper, silver, and combinations thereof. In one preferred embodiment, electrode 24 is fabricated of a thin layer of ITO or zinc oxide. The electrode layer 24 may further be patterned so as to define a plurality of discrete picture elements.

Thereafter deposited atop electrode layer 24 is a layer of a compensating material 26 adapted to match the physical characteristics of the electrode layer 24 with the subsequently deposited layer of hole transporting material 16 illustrated in FIG. 1. As noted hereinabove, the inorganic materials from which the electrode layer 24 is fabricated possess physical characteristics such as thermal expansion coefficient which are incompatible with those of the organic hole transporting layer 16. The inconsistencies and mismatch between the physical characteristics of these two layers contribute significantly to the degradation of the hole transporting material, and subsequently the failure of OED's. Accordingly, layer 26 is fabricated of a material which has characteristics which are similar to that of the light emitting layers disposed above it, while being consistent with those of the inorganic electrode layer upon which it is disposed. In this regard, layer 26 is preferably fabricated of a layer of conductive polymers, examples of which includes polythiophenes, polypyrroles, polyfurans, polyanilines, polyaminonaphthalene, polycarbazoles, polyindoles, polyphenylenes, polyisothianaphthalene, polyphenylene vinylenes), poly(phthalocyanines), poly (ferrocenes), derivatives thereof and combinations thereof.

In this embodiment, the layer of conductive polymer is specifically deposited by selective electrolysis, though many other known techniques can be used. Selective electrolysis is described in detail by Allen J. Bard et. al. in the book entitled "Electrochemical Methods, Fundamental and Applications". Electrochemical deposition of monomers to form conductive polymers on conductive electrodes can be achieved by one of two common techniques, the controlled current technique or the controlled potential technique. The controlled current technique is based on constant current electrolysis, while the controlled potential technique is based on constant voltage electrolysis, both of which are well known to those working in the conductive polymer fields. An example of the controlled current technique as used in a selective electrolysis process in association with the present invention consists of:

(1) preparing a monomer solution of the selected conductive polymer material and an electrolyte of specified concentrations in either an aqueous and/or a non-aqueous solvent medium in a container;

(2) placing substrate 22 with the patterned electrode 24 on it into the monomer/electrolyte solution;

(3) placing a counter electrode, usually made of a metal or metals, conductive carbon, or conductive glass, into the monomer/electrolyte solution;

(4) connecting the patterned electrode 24 on substrate 22 and the counter electrode to the positive and negative terminals of a constant current source, respectively; and (5) inserting a Coulomb meter into the electrolysis circuit to monitor the amount the charge passed throught the electrolysis solution.

The selective electrolysis commences once the circuit is closed. A film of conductive polymer is deposited on the patterned electrode 24. The thickness of the conductive polymer is controlled by the amount of charge passed through the monomer/electrolyte solution, which is generally monitored by the Coulomb meter inserted in the circuit.

In the controlled potential technique, the constant current source in the above procedure is replaced with a constant voltage and a reference electrode such as a saturated calomel electrode (SCE) or a saturated hydrogen electrode (SHE) is employed to monitor the electrolysis voltage.

In one preferred embodiment, the conductive polymer layer 26 is deposited to a thickness of between 25 and 2000 Å, at which at least 40% of light can still transmit through the conductive polymer film. The preferred thickness is between 50 and 500 Å.

After the electrolysis, the conductive polymer film deposited on the electeode 24 is washed with fresh solvent to remove any residual electrolyte and unreacted monomers, and dried before any organic electroluminescent materials are deposited.

The layer of conductive polymer on the surface of the OED possesses physical properties bridging the inorganic anode and organic hole transporting materials. Thus it enhances the thermal coefficient matching and the surface tension matching between the organic hole transporting layer materials and the inorganic anode electrode materials, making the hole transporting material less likely to aggregate or recrystallize. As a result, the OEDs have longer operation and storage lifetime. Since selective electrolysis has been widely used in industry, the method of OED's anode modification can be carried out via readily available, highly-reliable, inexpensive processes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A display device comprising an anode, a cathode and a light emitting layer, said anode comprising:

an anode substrate having a first layer of a conductive material deposited on a surface thereof; and a layer of a conductive polymer deposited atop said layer of conductive material, said conductive polymer being deposited by selective electrolysis and having a thermal expansion coefficient similar to that of said light emitting layer.

2. A display device as in claim 1, wherein said conductive material is a transparent conductive material.

3. A display device as in claim 1, wherein said conductive material is selected from the group consisting of indium tin oxide, indium oxide, tin oxide, zinc oxide, vanadium oxide, and combinations thereof.

4. A display device as in claim 1, wherein said conductive polymer is selected from the group consisting of polythiophenes, polypyrroles, polyfurans, polyanilines, polyaminonaphthalene, polycarbazoles, polyindoles, polyphenylenes, polyisothianaphthalene, polyphenylene vinylenes, poly(phthalocyanines), poly(ferrocenes), derivatives thereof and combinations thereof.

5. A display device as in claim 1, wherein said conductive polymer is deposited to a thickness of between 25 and 2,000 Å.

6. A display device as in claim 1, wherein said conductive polymer is preferably deposited to a thickness of between 50 and 500 Å.

7. A display device as in claim 1, wherein said display device is an organic electroluminescent display device.

8. A display device as in claim 7, wherein said light emitting layer includes at least a hole transporting material layer.

9. A display device as in claim 8, wherein said conductive polymer is operatively disposed between said layer of conductive material and said hole transporting material layer.

10. A method of fabricating an organic electroluminescent display device, comprising the steps of:

forming a display anode assembly including an anode substrate having a layer of conductive material disposed on a surface thereof, and characterized by a first thermal expansion coefficient;

depositing a layer of a conductive polymer on said anode assembly; and forming a layer of an organic electroluminescent light emitting media on said layer of conductive polymer, said light emitting media having a second thermal expansion coefficient, and said conductive polymer having a thermal expansion coefficient between that of said anode assembly and said light emitting media; and forming a display cathode assembly on said organic electroluminescent light emitting media.

11. A method as in claim 10, wherein said layer of conductive polymer is selected from the group consisting of polythiophenes, polypyrroles, polyfurans, polyanilines, polyaminonaphthalene, polycarbazoles, polyindoles, polyphenylenes, polyisothianaphthalene, polyphenylene vinylenes, poly(phthalocyanines), poly(ferrocenes), derivatives thereof and combinations thereof.

12. A method as in claim 10, wherein said conductive polymer is deposited to a thickness of between 25 and 2,000 Å.

13. A method as in claim 10, wherein said conductive polymer is preferably deposited to a thickness of between 50 and 500 Å.

* * * * *